US005575287A

United States Patent [19]
Eydelman

[11] Patent Number: 5,575,287
[45] Date of Patent: *Nov. 19, 1996

[54] INDUCTIVELY COUPLED RF COILS FOR MAGNETIC RESONANCE STUDIES

[75] Inventor: Gregory I. Eydelman, West Hempstead, N.Y.

[73] Assignee: Fonar Corporation, Melville, N.Y.

[*] Notice: The portion of the term of this patent subsequent to Feb. 16, 2013, has been disclaimed.

[21] Appl. No.: 8,667

[22] Filed: Jan. 25, 1993

[51] Int. Cl.$^6$ ............................................. A61B 5/055
[52] U.S. Cl. ............................. 128/653.5; 324/318
[58] Field of Search ........................ 128/653.2, 653.5; 324/318, 322

[56] References Cited

U.S. PATENT DOCUMENTS

| | | | |
|---|---|---|---|
| 4,784,146 | 11/1988 | Mancuso et al. | 128/653.5 |
| 5,003,265 | 3/1991 | Leussler | 324/318 |
| 5,351,688 | 10/1994 | Jones | 128/653.5 |
| 5,414,360 | 5/1995 | Westphal et al. | 324/318 |
| 5,416,413 | 5/1995 | Leussler | 128/653.5 |

Primary Examiner—Ruth S. Smith
Attorney, Agent, or Firm—Brooks Haidt Haffner & Delahunty

[57] ABSTRACT

An inductively coupled RF coil for magnetic resonance studies is disclosed comprising a tuned primary circuit comprising a primary inductor and a primary capacitor connected in series. The primary inductor has a first portion substantially disposed in a first plane and a second portion substantially disposed in a second plane. A tuned secondary circuit is provided comprising a secondary inductor and a secondary capacitor connected in series. The secondary inductor is proximate to and inductively coupled to the primary inductor. The secondary inductor comprises a first portion substantially disposed in the first plane and a second portion substantially disposed in the second plane. The secondary inductor can also comprise first and second loops connected in series, wherein the first loop has a first portion substantially disposed in the first plane adjacent to the first portion of the primary inductor and a second portion substantially disposed in the second plane adjacent to the second portion of the primary inductor. The second loop has a first portion substantially disposed in the first plane, adjacent to the first portion of the first loop and a second portion substantially disposed in a third plane essentially parallel to and spaced from the second plane. A method of using such RF coils is also disclosed.

10 Claims, 2 Drawing Sheets

5,575,287

INDUCTIVELY COUPLED RF COILS FOR MAGNETIC RESONANCE STUDIES

BACKGROUND OF THE INVENTION

The present invention relates to RF coils for use in magnetic resonance studies, and more particularly inductively coupled RF coils for use in medical magnetic resonance imaging (MRI).

The quality of medical magnetic resonance images that an MRI system can produce is potentially limited by the performance of various system components, such as the gradient sub-system, the transmitter, the receiver pre-amplifier and other components. The radio frequency (RF) receiver coil is just such a system component which potentially can limit the image quality that can be realized by the particular MRI system.

RF coils must meet several requirements in order to insure satisfactory system performance. They must exhibit a high quality factor (Q-value) when they are unloaded and the Q-value must not become too diminished when the coil is inserted in the MRI scanner. On the other hand, the coil must couple well with the region of a patient's anatomy which is to be imaged, and this will result in a diminished Q-value. Ideally, an RF coil will exhibit a nearly uniform sensitivity throughout the region of interest to be imaged, and the coil sensitivity will be much lower outside the region of interest. The coil must also conform well with the anatomy being imaged.

It is therefore an object of the invention to provide an improved RF coil for medical magnetic resonance imaging which exhibits good localized sensitivity when placed on a patient and which can be conveniently fitted to various parts of a patient's anatomy.

BRIEF DESCRIPTION OF THE INVENTION

According to the invention an RF coil for magnetic resonance studies is comprised of a resonant primary coil and a resonant secondary coil inductively coupled to the primary coil. Both coils are substantially in two planes with the resonant secondary coil parallel to the primary coil.

DETAILED DESCRIPTION OF THE INVENTION

Figure 1:
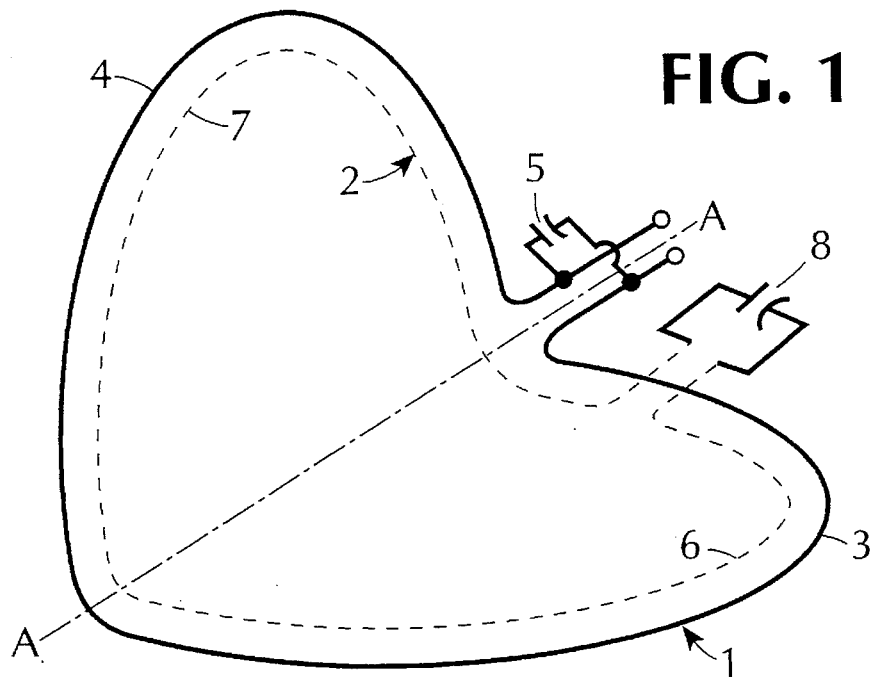
FIG. 1 is a perspective view of a preferred embodiment of the inductively coupled RE coil according to the invention.

FIG. 1 illustrates an RF coil for medical magnetic resonance studies having a resonant primary coil 1 which is inductively coupled to a resonant secondary coil 2. In the illustrated embodiment, the coil 1 is approximately circular and is folded along the dimension AA which is a chord of the circle so as to render the coil non-planar. A first part 3 of the primary coil 1 lies in a first plane, and a second part 4 lies in a second plane. The primary coil 1 is terminated by a capacitor 5 and has an output terminal pair for connection to an RF pre-amplifier.

The resonant secondary coil 2 is similarly configured with a first part 6 lying in the first plane and a second part 7 lying in the second plane. The secondary coil 2 is terminated by a capacitor 8 in order to resonate it. The adjacent spatial positioning of the primary coil 1 and secondary coil 2 provides for efficient inductive coupling between them.

The coil according to the invention is not limited to configurations in which the primary coil and secondary coil are congruent over their entire length. In the embodiment shown in FIG. 2 the primary coil 11 is identical to the previously described. active coil 1. The secondary coil 12, however, has portions which are not directly adjacent to the primary coil 11.

Figure 2:
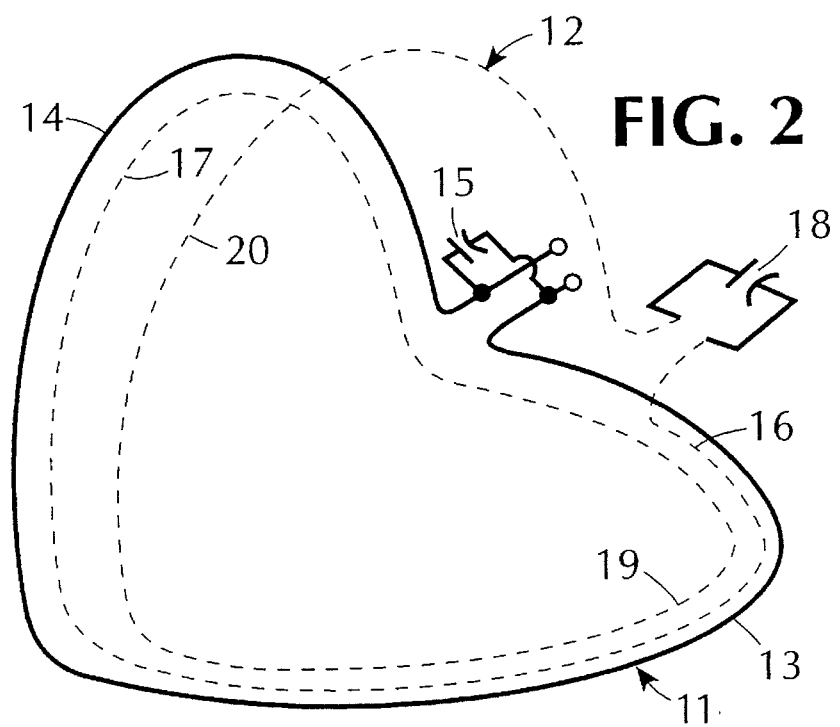
FIG. 2 is an perspective view of another embodiment of the RF coil according to the invention.

The primary coil 11 is comprised of a first part 13 which lies in a first plane, and a second part 14 which lies in a second plane. The secondary coil 12 similarly has a part 16 lying in the first plane and adjacent the part 13 of the primary coil, and the secondary coil has a part 17 lying in the second plane and adjacent the part 14 of the primary coil. In this embodiment the secondary coil 12 further includes a part 19 lying in the first plane and a part 20 which lies within a third plane that is parallel to the second plane and spaced from it. The coil shown in FIG. 2 is similarly terminated by capacitors 15 and 18 for resonating the primary coil and secondary coil, respectively.

The effect of the part 20 of the secondary coil is to increase the sensitivity of the coil within the region of space subtended by the two planes in which the coil lies. Because the part 20 is part of the secondary coil, magnetic resonance signals received by it are efficiently coupled to the primary coil 11 because of the proximity between the secondary coil and the primary coil. Thus, spatial sensitivity is expanded without any alteration to the primary coil 11.

Both embodiments of the invention can be made of stiff copper wire and terminated to resonate in the 12–25 MHz range to operate at magnetic field strengths of three to six kilo gauss. In practice, the coils are covered by an insulative coating.

Figure 3:
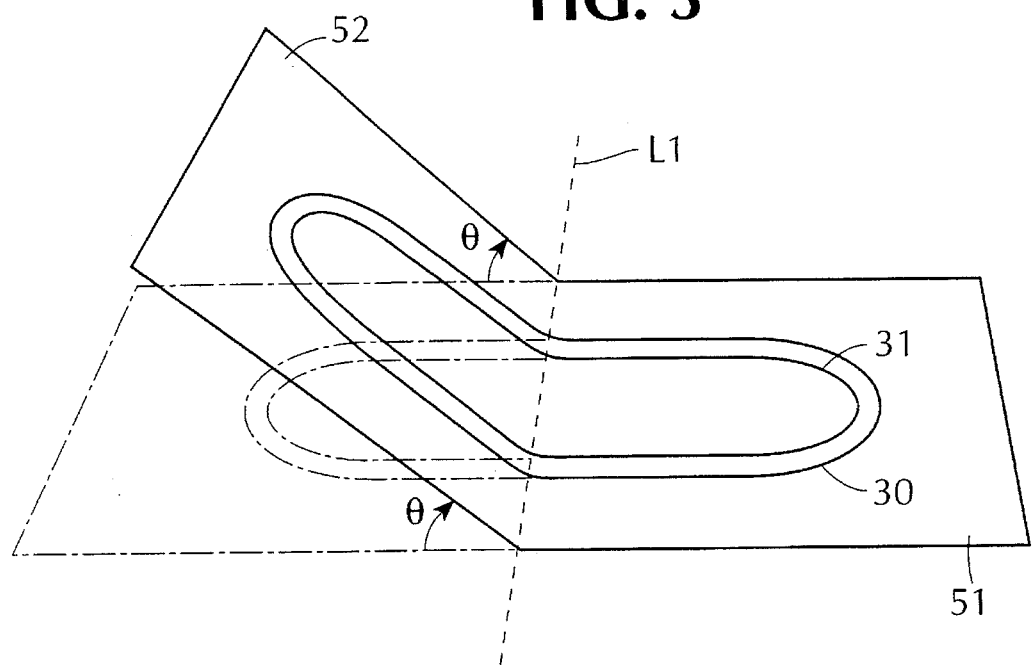
FIG. 3 illustrates the geometric principle, governing the structure of the RF coil according to the invention.

FIG. 3 illustrates the RF coil according to the invention in its most general form. A first plane S1 has disposed in it a resonant primary coil 30 and a resonant secondary coil 31. An imaginary line of direction L1, shown by dashed line, lies within the plane 81 and crosses the pair of coils 30, 31 where the two planar sections of the coils intersect. A second plane B2 making an angle θ with plane S1 contains part of the coils 30, 31. Shown in dashed line is the position that the coils 30, 31 would assume if the plane S2 were folded down into the plane S1, i.e., if the angel θ were to decrease to zero. This locus is referred to as the planar pre-cursor of the coil shape.

Figure 4:
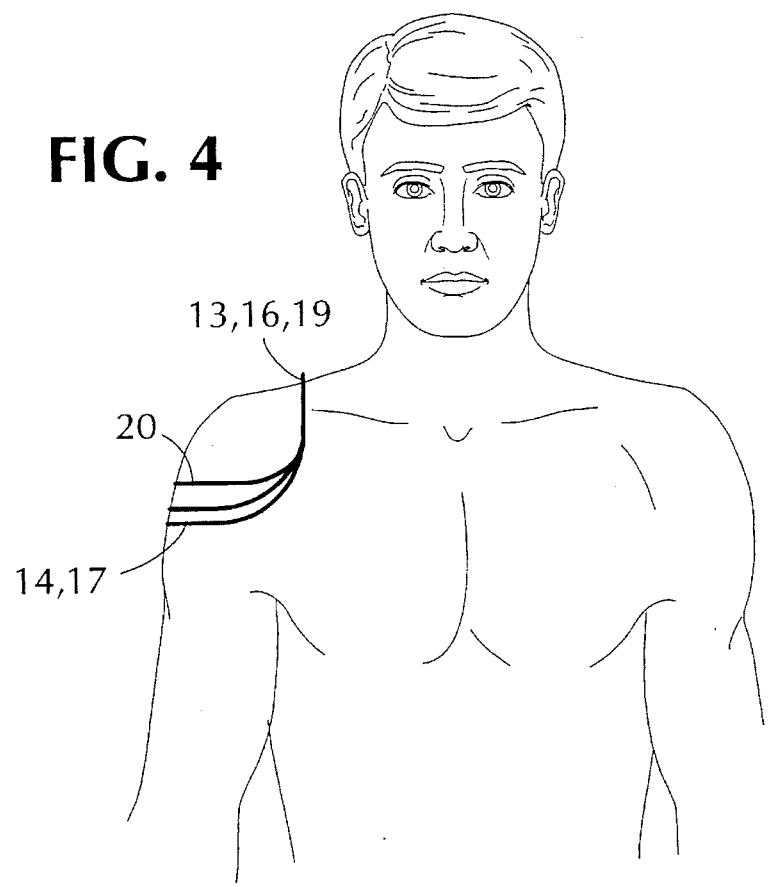
FIG. 4 illustrates the coil of FIG. 2, in position for shoulder imaging.

A coil according to the invention is used by placing it on the part of the person to be imaged, connecting it to the RF pre-amplifier of the MRI system, and then carrying out an imaging procedure. FIG. 4 illustrates the coil shown in FIG. 2 in position for shoulder imaging.

The RF coils according to the invention are not limited to any particular planar pre-cursors. The planar pre-cursor locus could be generally circular or oval, as previously described, or they could be some other arbitrary shape. Accordingly, the preferred embodiments of the invention described herein should be taken as exemplary, and not limiting, and the invention secured hereby is determined solely by reference to the following claims.

I claim:

1. An inductively coupled RF coil for magnetic resonance studies, comprising:

a tuned primary circuit comprising a primary inductor and a primary capacitor connected in series, the primary inductor having a first portion substantially disposed in a first plane and a second portion substantially disposed in a second plane wherein the second plane is different than the first plane;

a tuned secondary circuit comprising a secondary inductor and a secondary capacitor connected in series, the secondary inductor being proximate to and inductively coupled to the primary inductor, the secondary inductor having a first portion substantially disposed in the first plane and a second portion substantially disposed in the second plane.

2. The RF coil of claim 1, wherein the primary and secondary inductors are essentially equidistant from each other along substantially their entire lengths.

3. The RF coil of claim 1, wherein the primary inductor has a generally circular shape and is folded along a chord of the circular shape such that the first portion of the primary inductor is disposed in the first plane and the second portion of the primary inductor is disposed in the second plane.

4. The RF coil of claim 3, wherein the secondary inductor has a generally circular shape and is folded along a chord of the circular shape such that the first portion of the secondary inductor is disposed in the first plane and the second portion of the secondary inductor is disposed in the second plane.

5. The RF coil of claim 1, wherein the secondary inductor has a generally circular shape and is folded along a chord of the circular shape such that the first portion of the secondary inductor is disposed in the first plane and the second portion of the secondary inductor is disposed in the second plane.

6. The RF coil of claim 1, wherein the secondary inductor comprises first and second loops connected in series, the first loop having a first portion substantially disposed in the first plane adjacent to the first portion of the primary inductor and a second portion substantially disposed in the second plane adjacent to the second portion of the primary inductor and the second loop having a first portion substantially disposed in the first plane, adjacent to the first portion of the first loop and a second portion substantially disposed in a third plane essentially parallel to and spaced from the second plane.

7. The RF coil of claim 1, wherein the primary and secondary inductors have generally oval shapes and are folded along a chord of the shape such that the first portions of the primary and secondary inductors are substantially disposed in the first plane and the second portions of the primary and secondary inductors are substantially disposed in the second plane.

8. The RF coil of claim 1, wherein the primary and secondary inductors define a region for receiving an anatomical region of interest of a subject and the primary and secondary inductors receive MRI signals emitted from the anatomical region of interest.

9. An inductively coupled RF coil for magnetic resonance studies, comprising:

a tuned primary circuit comprising a primary inductor and a primary capacitor connected in series, the primary inductor having a generally oval shape and being folded along a chord of the shape such that the primary inductor has a first portion substantially disposed in a first plane and a second portion substantially disposed in a second plane;

a tuned secondary circuit comprising a secondary inductor and a secondary capacitor connected in series, the secondary inductor being proximate to and inductively coupled to the primary inductor, the secondary inductor comprising first and second loops connected in series, the secondary inductor having a generally oval shape and being folded along a chord of the shape such that the first loop has a first portion substantially disposed in the first plane adjacent to the first portion of the primary inductor and a second portion substantially disposed in the second plane adjacent to the second portion of the primary inductor and the second loop has a first portion substantially disposed in the first plane, adjacent to the first portion of the first loop and a second portion substantially disposed in a third plane essentially parallel to and spaced from the second plane.

10. An inductively coupled RF coil for magnetic resonance studies, comprising:

a tuned primary circuit comprising a primary inductor and a primary capacitor connected in series, the primary inductor having a first portion substantially disposed in a first plane and a second portion substantially disposed in a second plane;

a tuned secondary circuit comprising a secondary inductor and a secondary capacitor connected in series, the secondary inductor comprising at least one loop having a first portion, and a second portion substantially disposed in a third plane essentially parallel to and spaced from the second plane, the loop being proximate to and inductively coupled to the primary inductor.

* * * * *

UNITED STATES PATENT AND TRADEMARK OFFICE
CERTIFICATE OF CORRECTION

PATENT NO. : 5,575,287
DATED : November 19, 1996
INVENTOR(S) : Eydelman

It is certified that error appears in the above-indentified patent and that said Letters Patent is hereby corrected as shown below:

Column 1, line 46, "RE" should read --RF--;
line 47, "an" should be deleted--.
"AA" should read --A-A--.

Column 2, line 11, after "described" delete period "."; line 11, "active" should read --primary--;
line 43, "81" should read --S1--; line 45, "B2" should read --S2--; line 48, "angel" should read --angle--.

Signed and Sealed this

First Day of July, 1997

Attest:

BRUCE LEHMAN

*Attesting Officer*  *Commissioner of Patents and Trademarks*